United States Patent
Kuttner et al.

(10) Patent No.: US 6,831,582 B2
(45) Date of Patent: Dec. 14, 2004

(54) METHOD AND CIRCUIT CONFIGURATION FOR MIXING A DIGITAL SIGNAL WITH AN ANALOGUE SIGNAL

(75) Inventors: Franz Kuttner, Magdalen (AT); Peter Bogner, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/691,507

(22) Filed: Oct. 24, 2003

(65) Prior Publication Data

US 2004/0135714 A1 Jul. 15, 2004

(30) Foreign Application Priority Data

Oct. 30, 2002 (DE) .......................................... 102 50 632

(51) Int. Cl.[7] .............................................. H03M 1/66
(52) U.S. Cl. ...................................... 341/144; 341/152
(58) Field of Search ................................ 341/144, 152; 708/8

(56) References Cited

U.S. PATENT DOCUMENTS 3,987,280 A * 10/1976 Bauer ............................. 708/8
6,215,430 B1 * 4/2001 Smith et al. ................. 341/144
6,268,818 B1 * 7/2001 Xin et al. ..................... 341/152
6,549,153 B2 * 4/2003 Eriksson et al. ............. 341/144

FOREIGN PATENT DOCUMENTS

DE 197 00 249 A1 7/1998

OTHER PUBLICATIONS

Burr–Brown Corporation, *12–Bit 256MHz Monolithic Digital–To–Analog Converter*, DAC600, Nov., 1996, pp. 1–12.

* cited by examiner

*Primary Examiner*—Jean Bruner Jeanglaude
(74) *Attorney, Agent, or Firm*—Fitzpatrick, Cella, Harper & Scinto

(57) ABSTRACT

A digital to analogue converter with current output and a mixer with current input are used, and the entire circuit configuration operates within the current area. This means that the current output of the digital to analogue converter, if necessary, is directly connected to the current input of the mixer with intermediate insertion of a filter operating within the current area, without any conversion of the current signals occurring between the digital to analogue converter and the mixer into a voltage. Therefore, the circuitry cost can be reduced because various components are dispensed with and the signal quality improved, since distortions and noise are prevented due to current to voltage conversion at the end of the digital to analogue converter or voltage to current conversion at the input of the mixer.

11 Claims, 1 Drawing Sheet

PRIOR ART

METHOD AND CIRCUIT CONFIGURATION FOR MIXING A DIGITAL SIGNAL WITH AN ANALOGUE SIGNAL

BACKGROUND OF THE INVENTION

1. Field of the Invention

The present invention relates to a method as well as a circuit configuration for mixing a digital signal with an analogue signal.

2. Related Background Art

For mixing a digital signal with an analogue signal it is known to convert the digital signal into an analogue voltage signal, which is received by the mixer after being filtered. Since mixers are usually provided with current inputs, prior conversion of the filtered output signal from the digital to analogue converter into a current signal is necessary. A known device of this kind is represented in FIG. 3. In this case, a digital signal 4 is received by a digital to analogue converter 1. The digital to analogue converter 1 supplies a current signal 5, which is received by a resistance 11, so that a voltage signal, which is filtered in a filter 2, preferably a low-pass filter, lies on the resistance 11. The filter 2 supplies a voltage signal as output signal 6, which is converted in a voltage to current transformer 9 into a corresponding current signal 10, which is received by the mixer 3. Prior conversion into the current signal 10 is necessary, since the mixer 3 has a current input. The mixer 3 further receives a second signal 7, with which the digital signal 4 is to be finally mixed, and at its output supplies a mixing signal 8.

A disadvantage with the circuit configuration described is that the current signal 5 at the output of the analogue to digital converter 1 leads at the resistance 11 to voltage increase, which reacts on the output of the analogue to digital converter 1 and in this way modulates the current signal 5 at the output of the digital to analogue converter 1, whereby its output signal is disturbed. A further source of disturbance is caused by the necessary voltage to current transformer 9, which introduces further disturbances and in particular non-linearities. Furthermore, the components first necessary at the output of the digital to analogue converter 1 for current to voltage conversion and finally before the mixer 3 for voltage to current conversion means additional complexity, which has a negative effect on development, cost and production.

SUMMARY OF THE INVENTION

It is an object of the present invention to create a circuit configuration or a method for mixing a first, digital signal with a second signal, whereby low cost and little disturbance and signal distortion can be ensured.

The object according to the invention is achieved by a method with the features of claim 1 or a circuit configuration with the features of claim 7. The sub-claims in each case define preferred and advantageous embodiments of the present invention.

The entire circuit according to the invention is operated in the current domain or within the current area, for which purpose a digital to analogue converter with current output is used, which supplies a current input of a mixer without any current to voltage conversion.

Due to the few components, little noise, few distortions and low circuitry cost are achieved. The reason for this is that mixers with current input are normally used anyway and the digital to analogue converter deployed with systems of this kind mostly possesses a current output. A digital to analogue converter of this kind can have switched internal power sources, for example.

Preferably, the current output of the digital to analogue converter is terminated with a diode or generally with a non ohmic element, so that varying the current signal at the output of the digital to analogue converter results in no or only minor voltage fluctuation at the output of the digital to analogue converter. A component of this kind for terminating the current output of the digital to analogue converter, as in particular a diode, can preferably be arranged in the mixer, whereby advantageously a component existing in the mixer anyway is used for this.

In an advantageous refinement, a filter is inserted between the digital to analogue converter and the mixer, which however operates in the current domain or within the current area. The filter can be both passive and active. A passive filter in particular can be an LC filter.

If an active filter is used, trans-conductance amplifiers can be used, for example, in place of the operation amplifiers as active elements, which are normally used in the case of filters in the voltage area.

The filter used preferably has a low-pass characteristic, in order to eliminate higher-frequency fractions caused by digital to analogue conversion, but can also have any transmission characteristic. It is also conceivable to design the filter as a band-pass filter.

The solution according to the invention is advantageously used for wireless data communication, whereby the digital signal preferably represents an information signal to be transmitted and the second signal the carrier signal. Advantageously, the solution according to the invention finds application in mobile telecommunications, whereby the digital signal has digitally coded speech signals.

BRIEF DESCRIPTION OF THE DRAWINGS

The invention is described below in detail on the basis of two preferred embodiments with reference to the appended drawings.

DETAILED DESCRIPTION OF THE INVENTION

Figure 1:
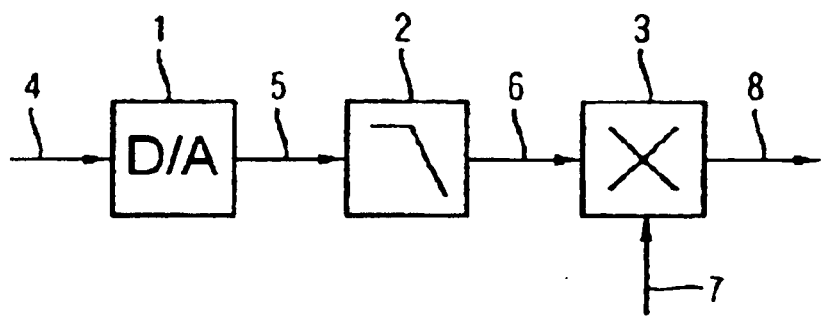
FIG. 1 shows the schematic structure of a circuit configuration for mixing a digital signal with a second signal in accordance with a first embodiment of the present invention.

The circuit configuration for mixing a digital signal 4 with a second signal 7, represented in FIG. 1, comprises a digital to analogue converter 1, which on the input side receives the digital signal 4 and on the output side supplies a current signal 5. The digital to analogue converter 1 possesses a current output, so that the output signal 5 is a current signal.

The current signal 5 is supplied to a filter 2, which is designed as a low-pass filter and operates within the current area. The filter 2 can be both passive and active and on the output side supplies a second current signal 6, which is received by a mixer 3.

The mixer 3 possesses two current inputs, one of which receives the second current signal 6 at the output of the filter 2 and the other one receives the second signal 7. The second signal 7 is also a current signal.

The mixer 3 on the output side supplies a mixing signal 8, which corresponds to the mixing result of the second signal 7 and the second current signal 6 derived from the digital signal 4.

The circuit configuration represented in FIG. 1 serves the wireless transmission of telecommunication data, in particular speech signals. For this purpose, the digital signal 4 contains the data or speech signals to be transmitted and the second signal 7 represents the carrier signal used for the radio transmission. An application of this kind in particular is mobile telecommunications, whereby the circuit configuration represented in FIG. 1 can be used in both a user terminal and a base station.

Figure 2:
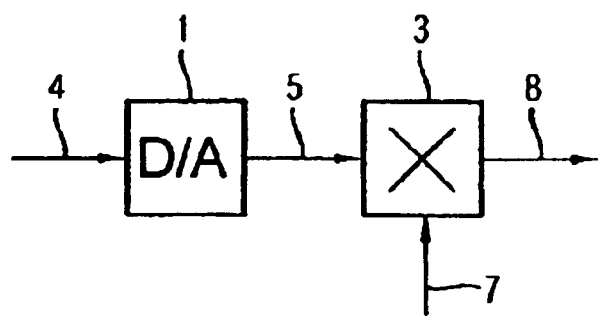
FIG. 2 shows the schematic structure of a circuit configuration for mixing a digital signal with a second signal in accordance with a second embodiment of the present invention.

In FIG. 2, a circuit configuration is represented in accordance with a second embodiment of the present invention, whereby in this case filtering of the output signal 5 from the digital to analogue converter 1 is dispensed with. Accordingly, the structure of the circuit configuration is simplified, since in this case the output signal 5 from the digital to analogue converter 1 is supplied directly to the mixer 3. Except for the filter 2 therefore the circuit configuration represented in FIG. 2 corresponds to that represented in FIG. 1. Also, the circuit configuration represented in FIG. 2 preferably serves the purpose of wireless signal transmission in particular of speech signals. With regard to the intended use and the kind of the signals the same as said above in connection with the circuit configuration represented in FIG. 1 applies for the circuit configuration according to the second embodiment.

Figure 3:
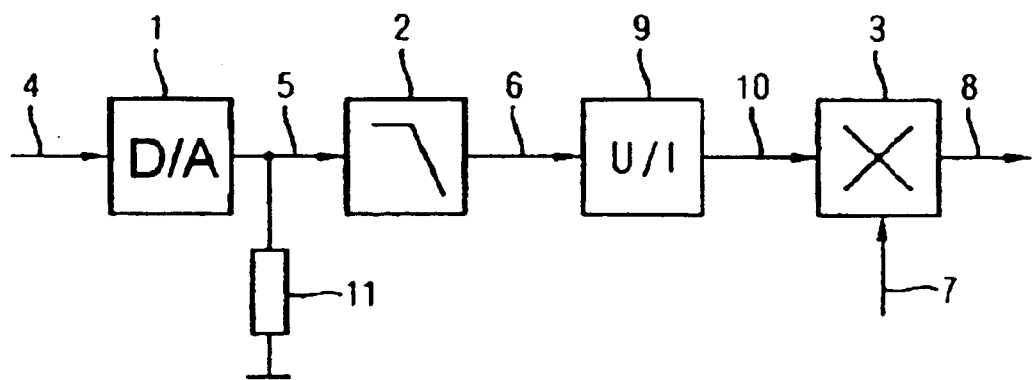
FIG. 3 shows the schematic structure of a known circuit configuration for mixing a digital signal with an analogue signal.

With the aid of the present invention therefore a decrease of the circuitry cost and in particular improvement of the signal quality can be achieved, since compared with the prior art circuit configuration represented in FIG. 3 components for current to voltage conversion or voltage to current conversion can be dispensed with and a digital to analogue converter 1 with current output can be driven in a more advantageous mode of operation due to the dispensable subsequent current to voltage conversion.

What is claimed is:

1. A method for mixing a first, digital signal with a second signal, comprising the steps of:

(a) converting the digital signal by means of a digital to analogue converter with current output into an analogue current signal;
    (b) supplying the analogue current signal to a current input of a mixer;
    (c) supplying the second signal to the mixer; and
    (d) mixing the analogue current signal and the second signal by means of the mixer.

2. A method according to claim 1, wherein the current signal before being supplied to the current input of the mixer is filtered by means of a filter operating within the current domain.

3. A method according to claim 2, wherein the current signal is low-pass-filtered.

4. A method according to claim 1, wherein the second signal is a carrier signal for wireless transmission of the digital signal.

5. A method according to claim 1, wherein the digital signal has digitally coded speech signals.

6. A method according to claim 1, wherein the method is used in mobile telecommunications.

7. A circuit configuration for mixing a digital signal with a second signal, the circuit configuration comprising a digital to analogue converter with a current output and a mixer with a current input, wherein the digital to analogue converter and the mixer are interconnected with one another in such a manner that the current output of the digital to analogue converter is connected to the current input of the mixer by means of a current signal.

8. A circuit configuration according to claim 7, wherein the current output of the digital to analogue converter is terminated with a diode.

9. A circuit configuration according to claim 8, wherein the diode is a component part of the mixer.

10. A circuit configuration according to claim 7, further comprising a filter operating within the current domain, inserted between the digital to analogue converter and the mixer.

11. A circuit configuration according to claim 7, wherein the digital to analogue converter converts the digital signal into an analogue current signal and supplies the analogue current signal to a current input of the mixer, and the mixer mixes the analogue current signal and the second signal.

* * * * *